US008816576B1

(12) United States Patent  (10) Patent No.: US 8,816,576 B1
Erion et al.  (45) Date of Patent: Aug. 26, 2014

(54) LED BULB, ASSEMBLY, AND METHOD

(75) Inventors: Jeffrey Allen Erion, Plymouth, MI (US); Alan John Duszkiewicz, Livonia, MI (US)

(73) Assignee: LED Optical Solutions, LLC, Washington, MI (US)

( * ) Notice: Subject to any disclaimer, the term of this patent is extended or adjusted under 35 U.S.C. 154(b) by 511 days.

(21) Appl. No.: 12/860,427

(22) Filed: Aug. 20, 2010

Related U.S. Application Data (60) Provisional application No. 61/235,558, filed on Aug. 20, 2009.

(51) Int. Cl.
*H01J 1/02* (2006.01)
*H01J 7/24* (2006.01)
*H01J 61/52* (2006.01)
*H01K 1/58* (2006.01)

(52) U.S. Cl.
USPC ................... 313/46; 362/249.02; 362/294

(58) Field of Classification Search
USPC .............. 313/46, 45, 498; 362/218, 294, 373, 362/249.02, 249.06, 264
See application file for complete search history.

(56) References Cited

U.S. PATENT DOCUMENTS

| | | | | |
|---|---|---|---|---|
| 5,152,601 A | * | 10/1992 | Ferng | 362/183 |
| 5,237,490 A | * | 8/1993 | Ferng | 362/183 |
| 5,806,965 A | * | 9/1998 | Deese | 362/249.04 |
| D405,201 S | * | 2/1999 | Lodhie | D26/2 |
| 5,890,794 A | * | 4/1999 | Abtahi et al. | 362/294 |
| 6,059,414 A | * | 5/2000 | Tsai | 359/516 |
| 6,425,678 B1 | * | 7/2002 | Verdes et al. | 362/244 |
| 6,483,254 B2 | * | 11/2002 | Vo et al. | 315/241 S |
| 6,525,668 B1 | * | 2/2003 | Petrick | 340/815.45 |
| 6,547,417 B2 | * | 4/2003 | Lee | 362/249.01 |
| 6,580,228 B1 | * | 6/2003 | Chen et al. | 315/185 R |
| 6,626,557 B1 | * | 9/2003 | Taylor | 362/235 |
| 6,634,770 B2 | | 10/2003 | Cao | |
| 6,880,956 B2 | * | 4/2005 | Zhang | 362/264 |
| 6,948,830 B1 | * | 9/2005 | Petrick | 362/229 |
| 6,991,351 B1 | * | 1/2006 | Petrick | 362/373 |
| 7,079,041 B2 | * | 7/2006 | Fredericks et al. | 340/815.45 |
| 7,182,480 B2 | * | 2/2007 | Kan | 362/242 |
| D575,183 S | * | 8/2008 | Seitz | D10/111 |
| 7,434,964 B1 | * | 10/2008 | Zheng et al. | 362/294 |
| 7,534,013 B1 | * | 5/2009 | Simon | 362/335 |
| 7,637,636 B2 | * | 12/2009 | Zheng et al. | 362/294 |
| 7,641,361 B2 | * | 1/2010 | Wedell et al. | 362/240 |
| 7,744,250 B2 | * | 6/2010 | Lee et al. | 362/294 |

(Continued)

FOREIGN PATENT DOCUMENTS

WO   WO 2008119392 A1 * 10/2008

*Primary Examiner* — Nimeshkumar Patel
*Assistant Examiner* — Glenn Zimmerman
(74) *Attorney, Agent, or Firm* — Dykema Gossett, PLLC (57) ABSTRACT

An LED bulb assembly includes a pinion, a plurality of LEDs, an upper heat sink, and a lower base. The plurality of LEDs are configured or arranged around a surface of the pinion, such that the optical axis of the LEDs face outward. An upper heat sink may be configured to provide heat transfer for the LEDs and pinion. The lower base may be configured to provide a connection to the pinion and an upper heat sink. In embodiments, one or more optical elements (e.g., lenses) or LED covers may be included. Further, for some embodiments, the upper heat sink may be upwardly offset a separation distance from an upper surface of the pinion, and may be configured to improve air flow to the upper heat sink.

38 Claims, 5 Drawing Sheets

(56) References Cited

U.S. PATENT DOCUMENTS

| | | | |
|---|---|---|---|
| 7,748,876 B2* | 7/2010 | Zhang et al. | 362/373 |
| 7,976,211 B2* | 7/2011 | Cao | 362/650 |
| 8,083,382 B1* | 12/2011 | Sebek | 362/373 |
| 8,092,032 B2* | 1/2012 | Pearse | 362/11 |
| 8,123,378 B1* | 2/2012 | Ruberg et al. | 362/249.02 |
| 8,157,416 B2* | 4/2012 | Lodhie | 362/249.02 |
| 2004/0037088 A1* | 2/2004 | English et al. | 362/545 |
| 2004/0165387 A1* | 8/2004 | Zhang | 362/294 |
| 2004/0195947 A1* | 10/2004 | Clark et al. | 313/46 |
| 2006/0050514 A1 | 3/2006 | Opolka | |
| 2006/0109661 A1* | 5/2006 | Coushaine et al. | 362/373 |
| 2007/0080645 A1* | 4/2007 | Smith | 315/83 |
| 2007/0102710 A1* | 5/2007 | Martter et al. | 257/79 |
| 2007/0159828 A1 | 7/2007 | Wang | |
| 2007/0195527 A1* | 8/2007 | Russell | 362/240 |
| 2007/0195548 A1* | 8/2007 | Wang | 362/555 |
| 2007/0230172 A1* | 10/2007 | Wang | 362/249 |
| 2008/0013316 A1 | 1/2008 | Chiang | |
| 2008/0158885 A1* | 7/2008 | Lai et al. | 362/294 |
| 2009/0046464 A1* | 2/2009 | Liu et al. | 362/294 |
| 2009/0080205 A1* | 3/2009 | Chang et al. | 362/373 |
| 2009/0097241 A1* | 4/2009 | Xu et al. | 362/234 |
| 2009/0103294 A1* | 4/2009 | Zhang et al. | 362/234 |
| 2009/0196070 A1* | 8/2009 | Kim | 362/613 |
| 2010/0128479 A1* | 5/2010 | Biebl et al. | 362/249.02 |
| 2010/0314985 A1* | 12/2010 | Premysler | 313/46 |
| 2010/0327725 A1* | 12/2010 | Huang et al. | 313/46 |
| 2011/0018417 A1* | 1/2011 | Lai et al. | 313/46 |
| 2011/0063843 A1* | 3/2011 | Cook | 362/249.02 |
| 2011/0089830 A1* | 4/2011 | Pickard et al. | 315/32 |
| 2011/0103061 A1* | 5/2011 | Kim | 362/249.02 |
| 2011/0234076 A1* | 9/2011 | Simon et al. | 313/46 |

* cited by examiner

Fig. 25

LED BULB, ASSEMBLY, AND METHOD

CROSS-REFERENCE TO RELATED APPLICATION

This application claims the benefit of U.S. Provisional Application No. 61/235,558, filed Aug. 20, 2009, which is hereby incorporated by reference as though fully set forth herein.

TECHNICAL FIELD

The disclosure relates to, among other things, a light-emitting diode (LED) bulb and assembly that is capable of high efficacy compared to high lumen filament light sources and high intensity discharge (HID) light source.

BACKGROUND

The efficacy of conventional filament light bulbs is very low—in the order of about 15 lumens per Watt. Even with the use of halogen gas to suppress vaporization of the tungsten, a maximum of about 22 lumens per Watt is anticipated. High intensity discharge (HID) can provide greater efficiency—in the order of about 75-80 lumens per Watt—as a system (including ballast losses). However, both of these conventional sources produce high temperatures, typically at the filament or arc. Moreover, both conventional sources generally have a limited life span as, for example, the filament of an incandescent bulb may be consumed, or the electrodes of an HID source may deteriorate with time and the gas within the bulb may be consumed.

Additionally, both high lumen filament and HID light sources generally share a spherical output with respect to light emission. That is, light is commonly distributed through virtually all directions. While this may be appropriate with many fixture types, there are potentially significant efficiency losses due to the optical systems generally used to manage/distribute light from such sources.

Moreover, when incandescent and HID sources operate at very high temperatures, there is the potential for burns if such source is contacted while operating or even some time after they have been extinguished. Further, HID sources may have very high starting voltages—often greater than 10,000 volts—which can pose a safety challenge.

LEDs offer a number of benefits in terms of functionality and operation. However, there are unique challenges associated with both heat and optical management. For LEDs to achieve the lumen output of traditional sources, the output of many sources are typically combined. Even though very high lumen LEDs in the order of 250-450 lumens per device have been produced, the ability of thermal systems to effectively manage the heat generated by closely spaced LEDs can present a significant challenge. Achieving comparable illumination levels to an HID source with an LED based device can present an even greater challenge.

While building interior illumination requirements may not demand high lumen levels, the exterior lighting market often demands very high lumen levels, which in part has led to the development of HID and high pressure sodium light sources. HID may represent a five-fold improvement in lighting efficiency compared with the previous technology of incandescent lighting, and high pressure sodium (HPS) may offer nearly an eight-fold improvement. While the two new technologies can offer significant lumen output, each source type may involve notable disadvantages. Each must have a weighty power supply to initiate an arc, and then a means to regulate the power to support the arc. Additionally, the time for the arc to initiate could be as high as six minutes. If a lamp where to go out and needed to be restarted, the time to regain full output could exceed 10 minutes.

HPS technology carries a further disadvantage in that the light output is monochromatic yellow since the light production is based on sodium. Color rendition of people and objects may be significantly degraded. That is, everything illuminated by an HPS light source may be virtually in one color.

High powered white LEDs can be utilized to overcome many of the disadvantages of both HID and HPS sources. Such LEDs can, inter alia, offer comparatively high efficiency, be coupled into optical systems, have very little heat projected forward, produce a broad spectrum of light, produce light substantially immediately when power is applied, have lifetimes from 3-10 times greater than HID or HPS, and retain their light output for a much longer time than the other types of light sources.

Among other things, the present invention takes into account the manner in which the benefits of LEDs may be optimized/maximized, while reducing or minimizing disadvantages that may be associated with conventional incandescent, HID and HPS sources.

SUMMARY

An LED bulb assembly includes a pinion, a plurality of LEDs, an upper heat sink, and a lower base. The plurality of LEDs are configured or arranged around a surface of the pinion, such that the optical axis of the LEDs face outward. An upper heat sink may be configured to provide heat transfer for the LEDs and pinion. The lower base may be configured to provide a connection to the pinion and an upper heat sink. In embodiments, one or more optical elements (e.g., lenses) or LED covers may be included. Further, for some embodiments, the upper heat sink may be upwardly offset a separation distance from an upper surface of the pinion, and may be configured to improve air flow to the upper heat sink.

BRIEF DESCRIPTION OF THE DRAWINGS

Embodiments of the invention are disclosed in the included drawing figures and illustrations. It is understood that the illustrated embodiments are not intended to limit the scope of the invention to the specific embodiments disclosed. On the contrary, the invention is intended to cover alternatives, modifications and equivalents, which may be included within the spirit and scope of the invention.

DETAILED DESCRIPTION

This disclosure teaches, inter alia, providing improved functionality in connection with an LED light source, which can at the same time, if desired, utilize the same/similar means for installation commonly used in connection with conventional light sources (e.g., HID).

In an embodiment of the invention, a means is provided for locating LEDs in an operational arrangement to better optimize initial light distribution. Moreover, the associated light may be controlled using a novel optical system and/or high temperatures generated in connection with the LED chip may be managed to preserve output light.

Figures 1, 2, 3, 4, 5, 6, 7:
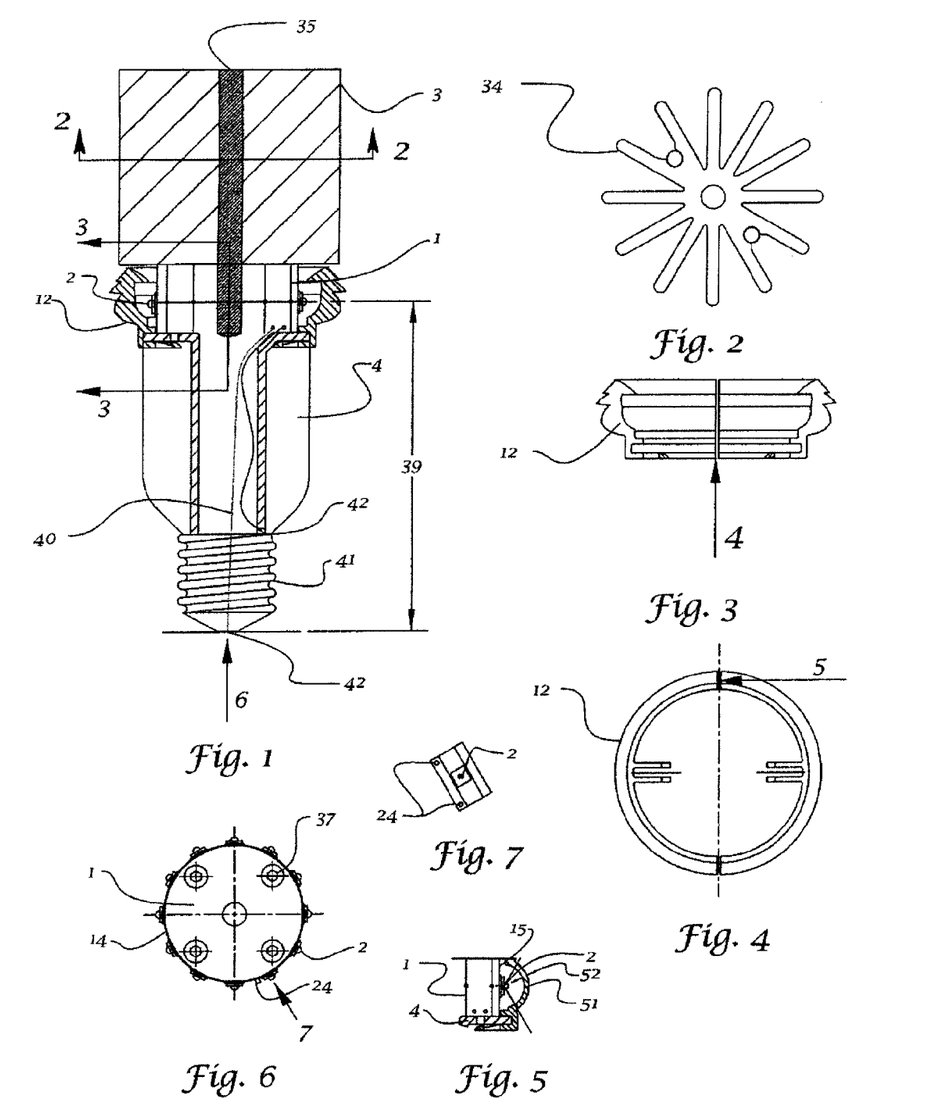
FIG. 1 is a side sectional view of an embodiment of an LED bulb assembly that generally illustrates the relationship of several components.
FIG. 2 is a plan representation of an upper heat sink including fins.
FIG. 3 is a side partial sectional view of an embodiment of an optic lens showing two symmetrical optical elements.
FIG. 4 is a plan view of an embodiment of an optic lens generally depicting circular lens elements and an attachment method.
FIG. 5 is a side view cross sectional view of an embodiment of an optional lens without optical features.
FIG. 6 is a bottom view of an embodiment of a base and pinion generally illustrating attachments.
FIG. 7 is a partial side view of an embodiment of an LED on a pinion with locating features.
Figure 8:
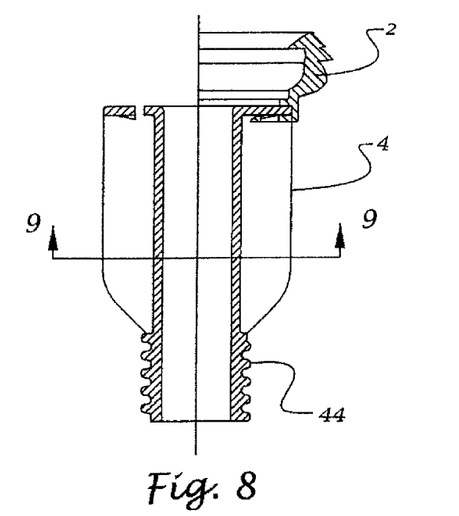
FIG. 8 is a side sectional view of an embodiment of a base and optic lens assembly.
Figure 9:
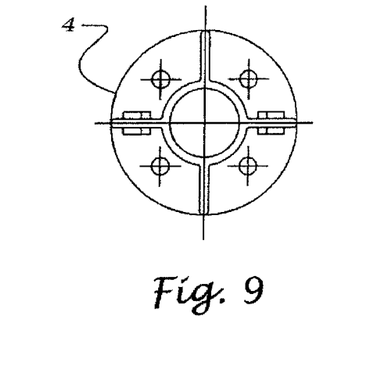
FIG. 9 is a general representation of a bottom view of an embodiment of a base including reinforcing ribs and attachment apertures.
Figure 10:
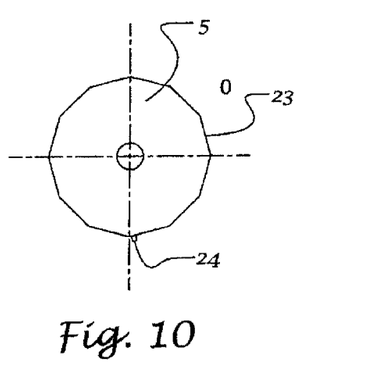
FIG. 10 is an end view of an embodiment of a multi-sided pinion with locator.
Figure 11:
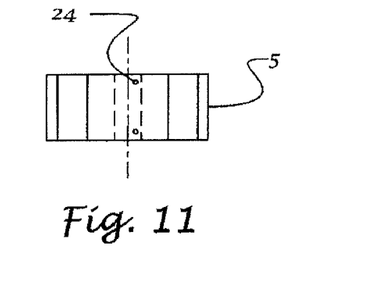
FIG. 11 is a side view of an embodiment of a multi-sided pinion with locators.
Figure 12:
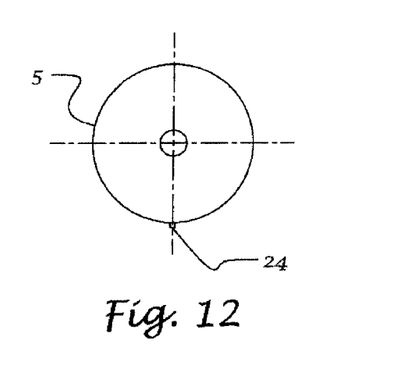
FIG. 12 is an end view of an embodiment of a circular pinion with locator.
Figure 13:
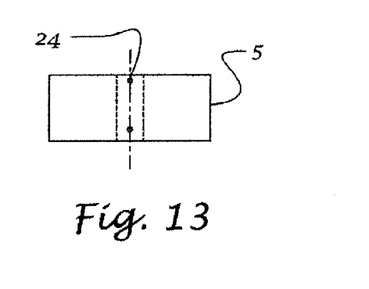
FIG. 13 is a side view of an embodiment of a circular pinion with locators.

In an embodiment, such as generally illustrated in FIG. 1, a bulb assembly may comprise: (a) at least one pinion 1 that retains or is connected with one or more LEDs 2; (b) an upper heat sink 3; and (c) a lower base 4.

In an embodiment a pinion may be generally cylindrical, although various other shapes are also contemplated. The pinion may be comprised of a high conductivity material such as, without limitation, aluminum, copper, or brass. In embodiments, a plurality of LEDs or multichip LEDs 2 may be configured or arranged around a surface of a pinion (see, e.g., pinion 5 shown in FIGS. 10-13) and may have their optical axis facing outward. The associated LEDs 2 may be mounted on circuit boards (e.g., circuit board 14 generally illustrated in FIGS. 14, 15, and 16) or backing that provide a means for conducting power to each LED. The individual boards or backing may then be connected to form a desired circuit (e.g., circuit 15 generally illustrated in FIG. 14) that is configured to power all or combinations of individual LEDs.

Although the arrangement of LEDs can provide a radial projection of light, additional control of the light may be provided. For example, in an embodiment, a shield (e.g., circular shield 9 generally illustrated in FIG. 19) can be provided above the LEDs. Such a shield may be configured to have a shape that significantly reduces/redirects upward light emitted from the LEDs, and/or may include an optical element (e.g., circular optic 12 generally illustrated in FIGS. 3 and 4) provided outwardly or outboard the LEDs 2. Such a shield may include a reflective surface (e.g., on its underside 10) and/or an optical prescription configured to direct light (e.g., from horizontal and above to approximately 45 degrees downward—such as generally represented by arrow 11 in FIG. 19). Further, if employed, an optical element (e.g., a circular optic) may be configured to employ total internal reflection (TIR) and/or refraction within the optical element (see, e.g., element 12 in FIGS. 3, 4, 22, and 24) to more efficiently use/direct light—for instance, to direct the light emitted in a more useful pattern.

In an embodiment, the use of a circular optical element (e.g., optical element 12) may efficiently direct light such that additional optical elements on an outer lens are unnecessary, or additional optical elements on an outer lens may be significantly reduced, whether in terms of number, area of coverage, or both.

Figures 15, 16, 17, 18, 19:
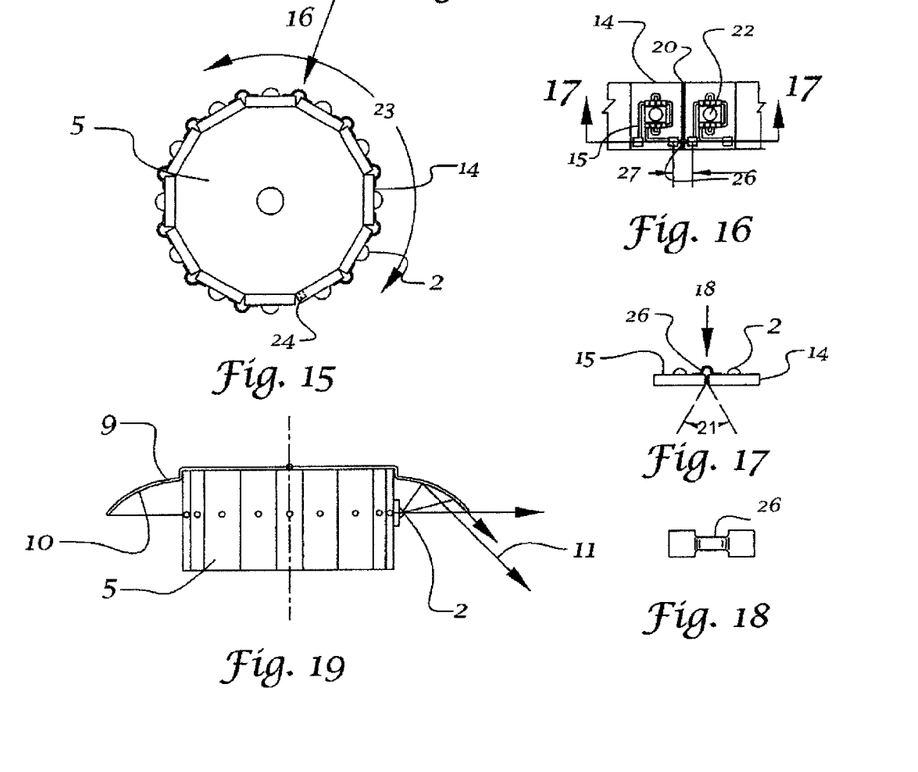
FIG. 15 is an end view of an embodiment of a pinion with an assembled LED strip and associated jumpers.
FIG. 16 is a partial view of an LED strip illustrating an embodiment of an interconnection.
FIG. 17 is a side view generally illustrating an embodiment of a jumper/interconnector provided between adjacent LEDs.
FIG. 18 is a top plan view of an embodiment of a jumper/interconnector.
FIG. 19 is a side view of an embodiment of a pinion with a reflector shield and generally depicted ray paths.

If employed, a shield may be comprised of metal and may be provided with a specular finish on a surface facing the LEDs (e.g., surface 10 shown in connection with FIG. 19). An optic lens (e.g., optic lens generally illustrated in FIGS. 3 and 4) may be comprised of high transparency plastic—for example, without limitation, acrylic. Since light projected from the LED carries virtually no infrared energy, there is little or no heat to be concerned with for an optical lens. As such, when employed, an optical lens may be provided in close proximity to the LED—which can provide a greater amount of usable light.

Figure 14:
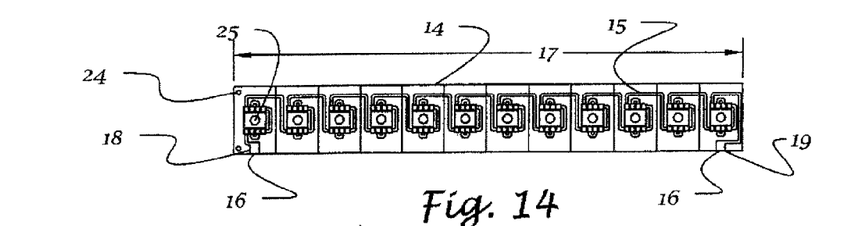
FIG. 14 is a planar layout of an embodiment of an LED strip generally illustrating LEDs, circuit paths, and locators.

In an embodiment, such as generally illustrated in FIG. 14, the LEDs may be connected or mounted to a circuit board. The circuit board may be an insulated metal substrate (IMS) 14 (e.g., metal core board (MCB) or metal core printed circuit board (MCPCB)), and may be comprised of aluminum or copper. Such an insulated metal substrate can be configured to retain each of a plurality of LEDs and to provide a means (e.g., circuit 15) for bringing electrical paths to a base 16 of the circuit board. It has been found that, by way of example, without limitation, an aluminum insulated metal substrate based circuit board can be used to help optimize thermal transfer between LEDs and the associated pinion. Moreover, if desired, the circuit board may be manufactured such that all of the boards are provided (and connected) on a strip (e.g., strip 17), and such strip may be configured so that a positive connection is provided at one end (e.g., end 18) and a negative connection is provided at the opposite end (e.g., end 19). However, it is noted that the connections can instead be provided at other locations along the strip. It is noted that some pinions employed with embodiments of the concept may include a draft angle (for example, and without limitation, 1° or 2°), and may comprise a faceted conical pinion. With such a configurations, a flexible strip may be formed that accommodates the shape of the pinion to which the strip will be attached. For instance, if a conical pinion having a draft angle is provided, an associated strip may be slightly curved or may have a slightly shorter length on one end so as to better fit the conical shape of the pinion.

In an embodiment, an elongated (or multi) circuit board (e.g., in the form of a strip) may be provided and may be scored (see, e.g., the feature designated 20 generally illustrated in FIG. 16) or otherwise configured at desired or designated positions or intervals so that the elongated board may be formed such that one or more LEDs may be provided between intervals. In an embodiment, the elongated board may be scored (e.g., by a metal scribe that could for instance have a 60-degree tip—which is generally depicted as angle 21 in FIG. 17) at substantially equal intervals and an LED may be provided centrally between scoring intervals. The scoring can permit a bending that can permit the elongated board (e.g., strip 17) to be configured into a desired shape (e.g., a segmented circle, such as generally represented by 23 in FIG. 15) that can be formed to substantially engage or coincide with the shape of a receiving portion of a pinion. If desired, the circuit board may also include one or more locating features, such as indexing apertures or formations 24.

By way of example, and without limitation, in an embodiment—such as generally illustrated in FIGS. 14 and 15, a multi-chip LED strip 25 with twelve (12) LEDs may be provided. Of course, more or less LEDs may be provided to suit output requirements, and the number is only generally limited by the capacity of the associated thermal controls. A plurality of connection elements (e.g., jumpers 26, such as generally illustrated in FIGS. 16, 17, and 18) may be provided to interconnect the LEDs 2 between each circuit board—i.e., may jump or connect boards across intervals (e.g., interval 27 generally illustrated in FIG. 16). In an embodiment the connection elements (e.g., jumpers 26) may be connected or attached during the manufacture of the board when the board is relatively flat or planar in nature—i.e., prior to bending or shaping the circuit board. By utilizing appropriate materials, such as those noted above, the connections for carrying power to the LEDs (including connection elements (jumpers)) will not fracture and will be functional when the elongated circuit board is provided and shaped or formed in a receiving portion of a pinion. It is noted that for embodiments, an IMS and PCB may provide circuit connections to the LEDs, and may be interconnected via jumpers, such as described. Alternatively, a flexible circuit may be employed that may avoid the need for jumpers.

Figures 20, 21, 22, 23:
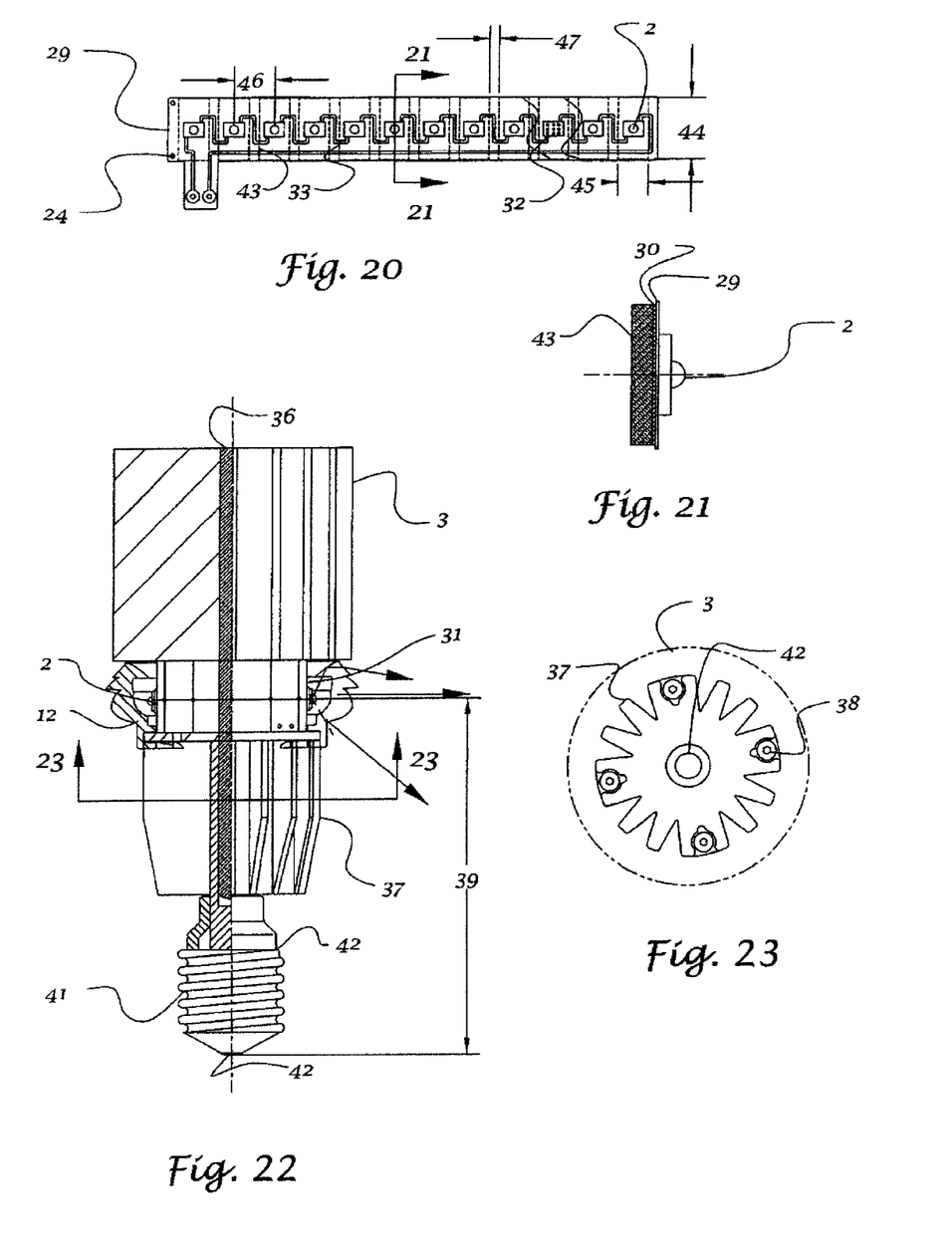
FIG. 20 is a top plan view of an embodiment of a flexible strip assembly with LEDs and a circuit path.
FIG. 21 is a side partial sectional view of an embodiment of a flexible strip including a "stiffener"
FIG. 22 is a side partial sectional view of an embodiment of an LED bulb assembly with a lower heat sink and a thermal transfer device.
FIG. 23 is an end view of an embodiment of a lower heat sink and a plurality of attachments.

In another embodiment, such as generally illustrated in FIG. 20, a plurality of LEDs 2 may be connected or mounted on a flexible circuit 29 (which generally comprises the structure illustrated within the expanse designated by 28). The flexible circuit 29 may, without limitation, be comprised of a thin polyester or a polyimide strip or film. The strip or film may for example and without limitation, be 3-4 inches long and have a thickness of about 0.003 inches or less. Further, such a flexible circuit may take the form of a variety of shapes, as is known in the flexible circuit art. With flexible-circuit-type embodiments, a plurality of LEDs may be provided along a flexible circuit strip at designated positions or intervals. If desired, on the back (i.e., the non-LED side of the strip), an adhesive may be provided to help secure the strip to a pinion (e.g., pinion 31 generally illustrated in FIG. 22). By way of example, without limitation, the adhesive may comprise a thin coat of thermally conductive adhesive and/or a two-sided thermal adhesive tape (e.g., the type in which an outer layer/liner on each side of the tape is removed prior to application). By employing an adhesive in some form, the strip with LEDs may be permanently attached around a surface of a pinion with a line of LEDs provided along an outer perimeter (which may be substantially circular in nature) of the pinion.

It is noted that for embodiments employing a flexible circuit or fiberglass laminate, additional features that assist with thermal management may also be present or provided. For example, in embodiments, beneath each LED, thermal vias (e.g., thermal vias 32 generally shown in FIG. 20) may be provided such that a metal (e.g., copper) plating that extends around and through holes providing an efficient thermal path from the LEDs to the pinion. Such vias may, for example, take the form of apertures through a film or lamination that are metal/conductive (e.g., copper) plated in a secondary manufacturing operation. With such configurations, even the walls of the apertures may be metal/conductive. Moreover, in embodiments, the circuit (e.g., circuit 33 generally illustrated in FIG. 20) for supplying power to each of a plurality of LEDs may be provided (e.g., printed) onto the board. Because of the thin nature of the film, the film may be formed around the pinion with little or no reduced effect to the circuit. It is noted that employing thermal vias is often done in connection with printed circuit boards and flexible circuit boards, more so than with metal core boards.

Embodiments may also provide for an upper heat sink, such as heat sink 3 generally illustrated in FIGS. 1 and 22. An upper heat sink can, if desired, provide for the primary cooling of the bulb-pinion assembly. For example, without limitation, an upper heat sink may be a cast or an extruded part and, for some applications, may be formed integrally with the pinion. The upper heat sink may include a plurality of fins 34 or other formations that may extend radially outward and can be configured to transfer/dissipate energy or heat away from a source. While certain numbers of fins are illustrated in the accompanying drawings, the invention is not limited to the depicted configurations, and various other fin or formation variations, including those known in the art for effectuating heat transfer, are contemplated. For instance, fins may be provided that include further projections to increase the associated thermal transfer efficiency. Moreover, an associated heat sink, or sinks, may be configured to adequately match the anticipated thermal characteristics of the LEDs used.

In addition to one or more heat sinks, at least one thermal transfer device (e.g., a high-efficiency thermal transfer device or "thermal siphon" or "heat pipe," such as pipes 35 and 36 illustrated in FIGS. 1 and 22) may be provided between the pinion and a heat sink. That is, without limitation, if an upper heat sink 3 is utilized, a thermal transfer device (e.g., pipe 35 or 36) may extend from the pinion (e.g., through the center thereof) to the upper heat sink 3. Such a device can employ thermal differential principles to move/remove heat. Similarly, as generally illustrated in FIG. 22, a thermal transfer device 36 could instead, or additionally, extend to a lower heat sink 37. In an embodiment, a thermal transfer device may be comprised of metal (e.g., copper) with a solid core; however, the device may also take the form of a "heat pipe" (e.g., of a type similar to those used in connection with computers and other electronic equipment to cool high-power electronic devices). If used, a thermal transfer device (e.g., comprising one or more heat pipes) may be configured to address a maximum anticipated thermal load of a system. For many embodiments, a heat pipe is a very small, but efficient, means for improving the magnitude and rate of heat transfer.

As generally illustrated in the figures, a lower base 4 may be configured to connect to a pinion—whether integrally or as a separate component. The lower base 4 may be comprised, for example and without limitation, of molded plastic. In an embodiment, the lower base may be configured to provide a connection to the pinion and an upper heat sink. A means for securing the base to the pinion—e.g., a plurality of screws 37 and 38 (such as generally illustrated in FIGS. 6 and 23)—may be provided to firmly connect the components. Additionally, the base 4 may be configured to control the distance between the centerline of the LEDs and a base mount. For example, without limitation, the vertical distance (e.g., generally designated as 39 in FIGS. 1 and 22) between the bottom tip of the base to the centerline of the LEDs may be about 3.38 inches (which is the focal length of many HID sources in the 70-150 Watt range). Of course, such a dimension may vary with respect to specific applications or future uses of inventive LED bulbs described herein. Further, the lower base may provide a power path (e.g., path 40 generally illustrated in FIG. 1) between the base and the LEDs.

In an embodiment, at the lower end of the base, a connection means (e.g., threading or screw 41 generally illustrated in FIG. 22) may be included and configured to match the "E26" or "E27" international conventions for the United States or European medium-sized bases, respectively, or the mogul style "E39" international convention. With such a feature, leads may be configured to extend from the base in the form of positive and negative connections 41 and 42 with respect to the connection with a circuit board or a flexible circuit.

It is noted that the teachings of the present invention may provide for a number of optional features. The following are just some examples.

In embodiments, a flexible circuit 29 may employ a "stiffener" (such as stiffener 43 generally illustrated in FIGS. 20 and 21) on its reverse (i.e., non-LED) side. One or more stiffeners may be attached by means of an adhesive and can provide a non-bendable surface area about the perimeter of the individual LEDs. Stiffeners may, for example, comprise thin plates of aluminum or other thermally conductive material. As such, the use of a stiffener may, among other things, additionally improve desired/associated heat flow. In an embodiment, the stiffener may, for instance, be about 0.031 inch thick. However, the invention is not limited to that dimension, and may be thicker or thinner as the need arises. With general reference to FIG. 20, the height 44 and width 45 of the stiffeners may be suited to the size of the LED and the spacing of LEDs 46 along the length of the flexible circuit. In this embodiment, the stiffener 43 isolates the LED and its connections from potential stress associated with bending of the flexible circuit during the assembly process. Any stress on the LED or its circuits as a result of bending of the flexible circuit may lead to premature failure of the LED. Therefore, bending of the circuit is permitted only at the desired areas (e.g., areas 47) between LEDs.

Figure 24:
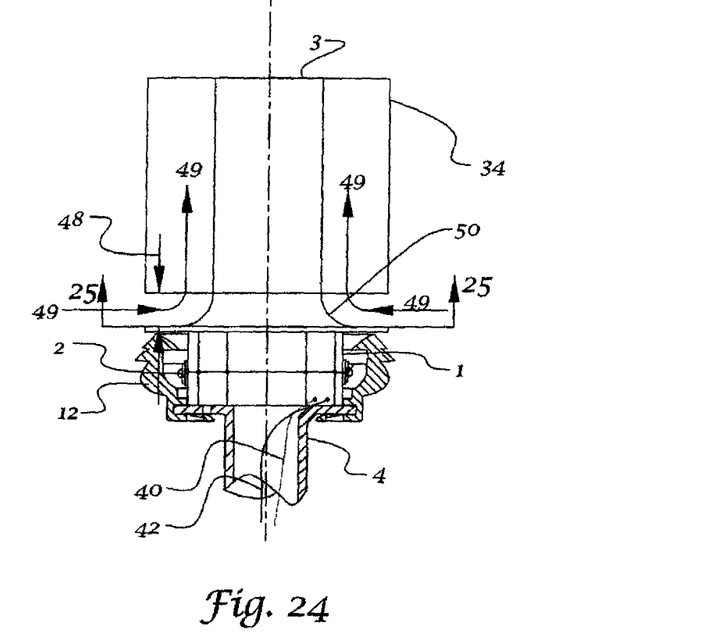
FIG. 24 is a partial sectional side view of an embodiment of an optional heat sink including convection assist.
Figure 25:
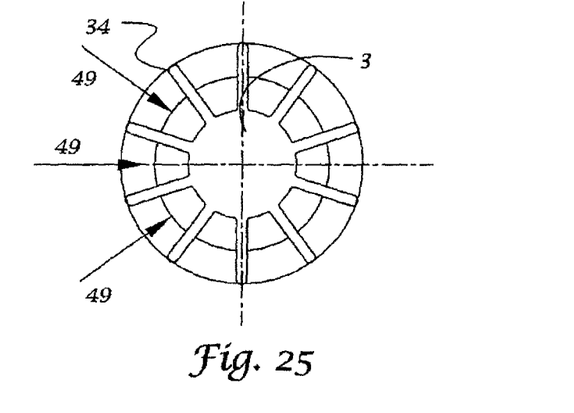
FIG. 25 is a general plan view of an embodiment of an optional heat sink.

With reference to FIG. 24, in an embodiment, the heat sink 3 may be lifted or offset by a separation distance 48 from an upper surface of the pinion. Such separation distance 48 can provide air space between the pinion 1 and the heat sink 3 to allow airflow (e.g., ambient airflow)—generally illustrated by arrow 49—to more easily enter a central finned area 34 of the heat sink, and to thereby assist in convection cooling. The separation distance 48 may, for example, be about 0.31 inches. However, the separation distance 48 may be more or less depending on size of heat sink and thermal cooling requirements. Additionally, a curvature or curved portion 50 may be provided at the base of the heat sink to, at least in part, create a laminar flow of the air toward the center of the finned area 34.

With reference to FIGS. 1 and 5, in an embodiment, a lens (which may comprise optical element 12) may surround pinion 1, and may be used to direct/shape light coming from an LED 2. The lens may provide for a specific beam pattern, and the lens may, if desired, be replaced with a cover lens (see, e.g., cover lens 51 in FIG. 5). The cover lens may comprise a transparent material (e.g., acrylic or polycarbonate). Since many conventional lighting fixtures already employ optical elements on their inner and outer surfaces, the need for complete light control may not be necessary. In such cases, lenses such as those discussed above, may principally provide protection for one or more LEDs—such as from touch during assembly and isolation from the electrical circuits (e.g., circuit 15) protected by the lens. Both the inner and outer surfaces (generally indicated by lines 52 in FIG. 5) of the lens may comprise simple radii to allow the light from the LED to pass through substantially unaffected.

The foregoing descriptions of specific embodiments of the present invention have been presented for purposes of illustration and description. They are not intended to be exhaustive or to limit the invention to the precise forms disclosed, and various modifications and variations are possible in light of the above teachings. The embodiments were chosen and described in order to explain the principles of the invention and its practical application, to thereby enable others skilled in the art to utilize the invention and various embodiments with various modifications as are suited to the particular use contemplated.

What is claimed:

1. An LED bulb assembly comprising:
   a pinion including a substantially cylindrical outer wall that defines an open interior space;
   a plurality of LEDs configured or arranged around an outer surface of the pinion, such that the optical axis of the LEDs face outward;
   an upper heat sink disposed above an uppermost portion of the pinion and the LEDs; and
   and a lower base disposed below the pinion,
   wherein the plurality of LEDs are mounted on a circuit board or backing that extends around a circumference of the pinion, and the circuit board or backing comprises a circuit extending around the circumference of the pinion and contacts the LEDs to power all or combinations of individual LEDs.

2. The bulb assembly of claim 1, wherein the pinion is substantially cylindrical.

3. The bulb assembly of claim 1, wherein the pinion is comprised of a material providing high thermal conductivity.

4. The bulb assembly of claim 1, wherein the pinion is comprised of aluminum, copper, or brass.

5. The bulb assembly of claim 1, wherein the circuit board or backing is arranged around the outer surface of the pinion.

6. The bulb assembly of claim 1, wherein the circuit board or backing includes an insulated metal substrate.

7. The bulb assembly of claim 1, wherein the circuit board or backing is comprised of aluminum, copper, or laminations of fiberglass materials.

8. The bulb assembly of claim 1, wherein the circuit board or backing includes thermal vias configured to transfer heat through the circuit board or backing.

9. The bulb assembly of claim 1, wherein the circuit board or backing is configured to conduct power to each of the plurality of LEDs.

10. The bulb assembly of claim 1, wherein two or more individual circuit boards or backings are connected in series to form a circuit configured to power all or combinations of individual LEDs.

11. The bulb assembly of claim 1, including at least one light control component.

12. The bulb assembly of claim 11, wherein the at least one light control component comprises a shield.

13. The bulb assembly of claim 12, wherein the shield is substantially circular and is positioned above, and extends radially outwardly from, the plurality of LEDs.

14. The bulb assembly of claim 12, wherein the shield is configured to block or inhibit at least a portion of the light emitted from one or more LEDs in an upward direction.

15. The bulb assembly of claim 11, wherein at least one light control component includes a specular reflective surface for reflecting at least a portion of the light emitted from one or more LEDs in an outward and downward direction.

16. The bulb assembly of claim 1, including an optical element configured to modify emitted light.

17. The bulb assembly of claim 16, wherein the optical element is configured to principally direct light in a downward direction.

18. The bulb assembly of claim 1, wherein an optical element is configured to provide total internal reflection (TIR) with respect to at least a portion of the light emitted from one or more LEDs.

19. The bulb assembly of claim 1, including an optic lens.

20. The bulb assembly of claim 1, wherein the plurality of LEDs are mounted on separate circuit boards provided or connected to a strip.

21. The bulb assembly of claim 20, wherein the strip is configured to provide a positive connection and a negative connection.

22. An LED bulb assembly comprising:
a pinion including a substantially cylindrical outer wall that defines an open interior space;
a plurality of LEDs configured or arranged around an outer surface of the pinion, such that the optical axis of the LEDs face outward;
an upper heat sink disposed above an uppermost portion of the pinion and the LEDs; and
a lower base disposed below the pinion,
wherein the plurality of LEDs are mounted on a circuit board or backing to form a strip that extends around a circumference of the pinion, and the strip is configured with a plurality of scored intervals, and one or more connection elements are provided across the scored intervals to connect the LEDs to form a circuit.

23. The bulb assembly of claim 22, wherein the intervals are scored to provide substantially equal spacing between intervals.

24. The bulb assembly of claim 22, wherein the spacing and configuration of a plurality of intervals provide a formation to substantially engage or coincide with the shape of a receiving portion of a pinion.

25. The bulb assembly of claim 1, wherein the circuit board or backing includes one or more locating features.

26. The bulb assembly of claim 1, wherein the circuit board or backing includes a plurality of connection elements configured to interconnect the LEDs between adjacent circuit boards or backings.

27. The bulb assembly of claim 1, wherein an adhesive connects one or more of the LEDs to the pinion.

28. The bulb assembly of claim 1, wherein the upper heat sink is formed with the pinion as a single unitary component.

29. The bulb assembly of claim 1, wherein the upper heat sink includes a plurality of fins or other formations that extend radially outward and are configured to transfer or dissipate energy or heat.

30. The bulb assembly of claim 1, including at least one thermal transfer device provided between the pinion and heat sink.

31. The bulb assembly of claim 30, wherein the thermal transfer device comprises a heat pipe or heat siphon.

32. The bulb assembly of claim 1, including a lower heat sink.

33. The bulb assembly of claim 1, wherein the lower base is formed with the pinion as a single unitary component.

34. The bulb assembly of claim 1, wherein the upper heat sink is offset by a separation distance from an upper surface of the pinion.

35. An LED bulb assembly comprising: a pinion; a plurality of LEDs configured or arranged around a surface of the pinion, such that the optical axis of the LEDs face outward perpendicular to a center axis of the pinion; an upper heat sink; and a lower base having a power path; wherein the upper heat sink sets above and on the uppermost surface of the pinion and has fins that extend radially outward further than each of the plurality of LEDs taken individually from the pinion center axis, and wherein the plurality of LEDs are located between the upper heat sink and the lower base.

36. The bulb assembly of claim 1, including a lens that substantially surrounds the pinion and is configured to direct or shape light emitted by the plurality of LEDs.

37. An LED bulb assembly comprising:
a pinion including a substantially cylindrical outer wall that defines an open interior space;
a plurality of LEDs configured or arranged around an outer surface of the pinion, such that the optical axis of the LEDs face outward;
an upper heat sink disposed above an uppermost portion of the pinion and the LEDs; and
a lower base disposed below the pinion,
wherein the LEDs are provided on a flexible circuit board that extends around a circumference of the pinion and the LEDs are connected to form a circuit that extends around the circumference of the pinion, and the flexible circuit board includes a stiffener provided on the opposite side of the LEDs.

38. An LED bulb assembly comprising:
a pinion including a substantially cylindrical portion having a cylindrical outer wall that defines an open interior space;
a plurality of LEDs configured or arranged around an outer surface of the pinion, such that the optical axis of the LEDs face outward;
an upper heat sink disposed above an uppermost portion of the pinion and the LEDs; and
a lower base disposed below the pinion;
wherein the plurality of LEDs are mounted on a circuit board or backing that extends around a circumference of the pinion and the LEDs are connected to form a circuit that extends around the circumference of the pinion; the circuit board or backing is configured to conduct power to each of the plurality of LEDs; and the upper heat sink is offset by a separation distance above an uppermost surface of the pinion, and a curvature or curved portion is provided at or about the base of the upper heat sink, the curvature or curved portion configured to, at least in part, create a laminar flow of air in an inward and upward direction.

* * * * *

UNITED STATES PATENT AND TRADEMARK OFFICE
CERTIFICATE OF CORRECTION

| | | |
|---|---|---|
| PATENT NO. | : 8,816,576 B1 | Page 1 of 1 |
| APPLICATION NO. | : 12/860427 | |
| DATED | : August 26, 2014 | |
| INVENTOR(S) | : Jeffrey Allen Erion and Alan John Duszkiewicz | |

It is certified that error appears in the above-identified patent and that said Letters Patent is hereby corrected as shown below:

In the Claims:

COLUMN 8, line 31 (Claim 1, line 9), delete "and"

COLUMN 8, line 36 (Claim 1, line 14), "contacts" should be -- connects --.

Signed and Sealed this
Sixteenth Day of December, 2014

Michelle K. Lee
*Deputy Director of the United States Patent and Trademark Office*